United States Patent [19]

Kim et al.

[11] Patent Number: 5,404,030
[45] Date of Patent: Apr. 4, 1995

[54] ONE-BIT MEMORY CELL IN STATIC RANDOM ACCESS MEMORY DEVICE WITH PMOS THIN FILM TRANSISTOR LOAD PAIR

[75] Inventors: Jhang-Rae Kim, Kyungki-do; Sung-Bu Jun, Busan, both of Rep. of Korea

[73] Assignee: Samsung Electronics Co., Ltd., Suwon, Rep. of Korea

[21] Appl. No.: 983,174

[22] Filed: Nov. 30, 1992

[30] Foreign Application Priority Data

Nov. 30, 1991 [KR] Rep. of Korea .................. 91-21975

[51] Int. Cl.[6] .................. H01L 27/11; H01L 29/78
[52] U.S. Cl. .................. 257/67; 257/69; 257/369; 257/903
[58] Field of Search .................. 257/66, 903, 67, 69, 257/296, 297, 298, 369, 377

[56] References Cited

U.S. PATENT DOCUMENTS

| | | | |
|---|---|---|---|
| 3,673,471 | 6/1972 | Klein et al. | 257/903 |
| 4,980,732 | 12/1990 | Okazawa | 257/903 |
| 5,132,771 | 6/1992 | Yamanaka et al. | 257/903 |
| 5,159,416 | 10/1992 | Kudoh | 257/903 |
| 5,172,203 | 12/1992 | Hayashi et al. | 257/66 |

FOREIGN PATENT DOCUMENTS

0186051  9/1985  Japan .................. 252/67

OTHER PUBLICATIONS

Furuta et al., "Hot-Carrier Induced Ion/Ioff Improvement of Offset PMOS TFT", NEC Corporation, pp. 27 and 28.

Uemoto et al., "A High-Performance Stacked-CMOS SRAM Cell by Solid Phase Growth Technique", 1990 Symposium on VLSI Technology, 1990 IEEE, pp. 21 and 22.

Ikeda et al., "A Polysilicon Transistor Technology for Large Capacity SRAMs", 1990 IEEE, pp. 18. 1.1–18. 1.4.

*Primary Examiner*—Rolf Hille
*Assistant Examiner*—Alexander Oscar Williams
*Attorney, Agent, or Firm*—Charles R. Donohoe; Robert A. Westerlund, Jr.; Stephen R. Whitt

[57] ABSTRACT

An improved static random access memory device of the CMOS load memory cell type for storing one-bit information is capable of 4M bit or greater memory capacity. Each memory cell includes two transfer transistors, two driving transistors, and two load transistor elements. Each load transistor element is a PMOS thin film transistor and comprises a source formed of first and second conductive layers and connected to a constant power source line, and a drain also formed of the first and second conductive layers and connected to the drain of a corresponding one of the driving transistors. A channel region of each load transistor element is composed only along the region defined by the second conductive layer and a respective gate is formed of a third conductive layer which is separated from the channel region by a gate insulating layer.

12 Claims, 8 Drawing Sheets

FIG. 8A
| DEPO. TEMP. (°C) | NUCLEAR RATIO (/cm²sec) | GROWTH RATION (nm/sec) | MAX. GRAIN SIZE (μm) |
|---|---|---|---|
| 455 | 200 | 0.13 | 7 |
| 485 | 810 | 0.14 | 5 |
| 515 | 1100 | 0.13 | 3.5 |
FIG. 8B
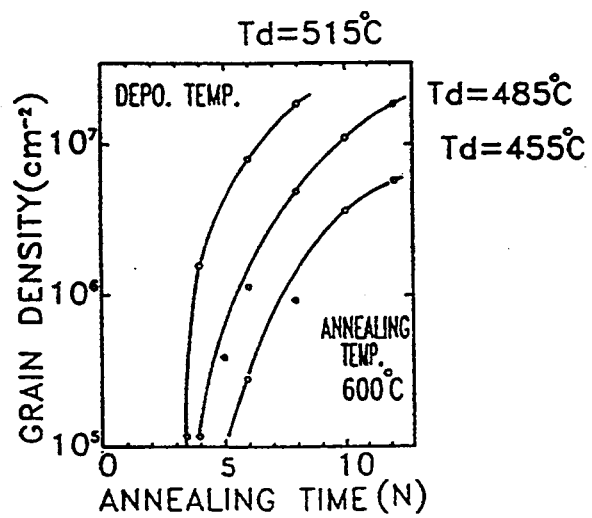
FIG. 9A
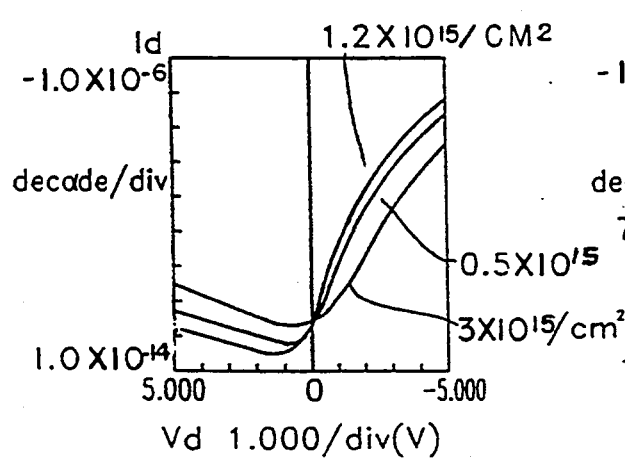
FIG. 9B
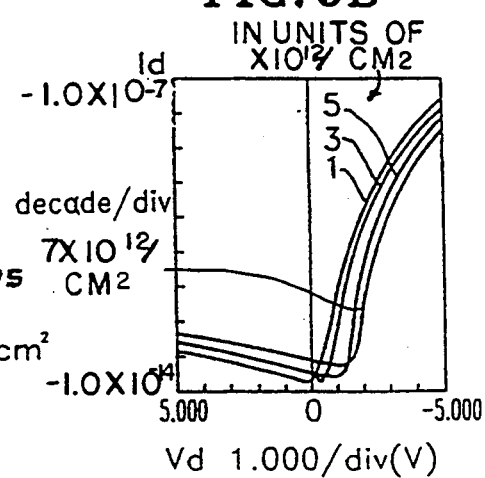

ONE-BIT MEMORY CELL IN STATIC RANDOM ACCESS MEMORY DEVICE WITH PMOS THIN FILM TRANSISTOR LOAD PAIR

BACKGROUND OF THE INVENTION

1. Field of the Invention.

The present invention relates to a semiconductor memory device and manufacturing method thereof, and more particularly to a semiconductor memory device and manufacturing method thereof, having improved cell stability, low power dissipation and increased cell immunity to soft errors.

2. Description of the Related Art.

Research in the field of static random access memory (SRAMs) devices is now being conducted to take advantage of the latest advances in semiconductor technology. SRAM memory cells are presently manufactured consisting essentially of two transfer transistors, two driving transistors and two load elements.

Although SRAM memory capacity is smaller than that of dynamic random access memories (DRAMs), SRAMs are employed in various applications requiring memory including small and medium scale systems, such as microcomputer systems or terminals. SRAMs are easy to handle and operate quite efficiently even for high speed operations. SRAMs are generally classified into one of three types relating to the type of load element selected. A depletion load-type memory cell uses a depletion-mode NMOS transistor which serves as the load. A polysilicon-type load memory cell employs high-resistant polysilicon instead. A CMOS-type load memory cell uses a PMOS transistor.

The depletion load-type memory cell, however, is rarely employed in memory devices having greater than 16 Kbit capacity given its characteristic high power consumption.

While the CMOS-type memory cell can markedly decrease power dissipation, its cell area is larger than the other two types and in normal operation it is susceptible to a latch-up phenomenon which restricts its utilization. Until recently, the trend was towards use of high-resistant polysilicon load-type memory cell SRAMs in a wide number of applications. High-resistant polysilicon load-type memory cells, such as shown in FIG. 1, have a relatively simple manufacturing process and exhibit low power dissipation when the resistance of the polysilicon is increased.

In addition, when three dimensionally arranging each high-resistant polysilicon load with respect to its corresponding driving transistor, memory cell area is substantially decreased.

For these reasons, the high-resistant polysilicon load-type memory cell is most suitable for large-scale integrated SRAMs.

Recent developments in the CMOS technique, however, have led designers to reevaluate the usefulness of the CMOS-type memory cell SRAM. The prospect of such devices consists of having a non-volatile CMOS-type memory cell SRAM provided with a battery back-up system. Such a device would be capable of retaining previously stored information despite possible power supply interruptions, given its remarkably low power dissipation in a standby mode of operation.

By further introducing silicon-on-insulator (SOI) techniques into the design of CMOS-type memory cell SRAMs, cell area can be further reduced by taking advantage of developments in three-dimensional CMOS manufacturing techniques.

In addition, because numerous problems were encountered during manufacture of high-packing density high-resistant polysilicon load-type memory cell SRAMs, the CMOS-type load memory cell SRAM architecture is beginning to gain great appeal among SRAM designers.

In order to manufacture a low power dissipation SRAM of high-resistant polysilicon load-type memory cells of 4M bit or greater packing density, the effective resistance of the polysilicon material employed as the load element must be increased.

However, a resistance of more than approximately 10 T$\Omega$ is required to maintain a standby current of approximately 1 $\mu$A in a 4 Mb SRAM type cell, at which point charging current supplied to the cell decreases abruptly, thereby impeding cell stability.

In addition, the resistance of the polysilicon material must be approximately 100 T$\Omega$ at room ambient temperatures in order to maintain a resistance of above 10 T$\Omega$ in standby mode. Such tolerances present difficulties in the manufacturing process, particularly if a supply voltage is decreased to prevent degradation due to hot carriers.

Similarly, the supply current and junction leakage current may approach equivalency which results in an increase in soft-error rate.

SUMMARY OF THE INVENTION

In an attempt to increase packing density of SRAM devices to 4M bit and greater capacities, a method for three-dimensionally forming a CMOS-type load memory cell SRAM, which has been heretofore formed two-dimensionally, is now disclosed.

A PMOS transistor is formed on an NMOS transistor (heretofore formed individually in different type wells in the same wafer) by introducing SOI structural concepts and thin film transistor (TFT) techniques.

The method of the present invention includes forming a TFT PMOS transistor which functions as one of two SRAM memory cell load elements. The TFT PMOS serves not only to decrease cell area to as much as the cell area of conventional high-resistant polysilicon load-type memory cells, but also serves to prevent the problem of latch-up.

Furthermore, because the known disadvantages (i.e., high power dissipation, low soft-error immunity, and poor cell stability) of high-resistant polysilicon load-type memory cell SRAMs are overcome, the method of the present invention should in all likelihood become the standard by which all next-generation SRAMs will be measured.

Therefore, it is an object of the present invention to provide a highly reliable semiconductor memory device.

It is another object of the present invention to provide a method suitable for manufacturing the semiconductor memory device.

To achieve the object of the present invention, there is provided a semiconductor memory device capable of storing 1-bit information by including two transfer transistors, two driving transistors, and two load elements, wherein each load element comprises:

a source formed of first and second conductive layers, and connected to a constant power source line;

a drain formed of the first and second conductive layers, one portion thereof being connected to the drain of the driving transistor;

a channel composed of the second conductive layer only; and a gate formed of a third conductive layer, and formed on the channel with a gate insulating layer interposed therebetween.

To achieve another object of the present invention, there is provided a method for manufacturing a semiconductor memory device capable of storing 1-bit information by including two transfer transistors, two driving transistors and two load elements, wherein a method for manufacturing each load element comprises the steps of:

forming a first conductive layer;

doping an impurity of a first conductivity type on the whole surface of the first conductive layer;

removing the first conductive layer on a region where a channel will be formed;

forming a second conductive layer on the whole surface of the resultant structure;

doping an impurity of a 1st second-conductivity type on the whole surface of the second conductive layer;

partially removing the first and second conductive layers, and forming a source, a drain and a constant power source line;

forming a gate oxide layer on the whole surface of the resultant structure;

forming a contact hole to allow the drain of the respective load element and the drain of the driving transistor to be partially exposed;

forming a third conductive layer on the whole surface of the resultant structure;

doping an impurity of a 2nd second-conductivity type on the whole surface of the third conductive layer; and partially removing the third conductive layer, and forming a connection line for connecting the drain of the load device and the drain of the driving transistor and forming a gate of the load device.

BRIEF DESCRIPTION OF THE DRAWINGS

The above objects and other advantages of the present invention will become more apparent by describing in detail a preferred embodiment thereof with reference to the attached drawings in which:

FIG. 8A and 8B respectively represent a table and a graph which show the grain size and the change of density as a function of deposition temperature variation of amorphous silicon;

FIGS. 9A and 9B represent graphs showing the changes in the on/off current ratio of a PMOS thin film transistor as a function of impurity and doped density vacation;

DETAILED DESCRIPTION OF THE PREFERRED EMBODIMENTS

Figure 1:
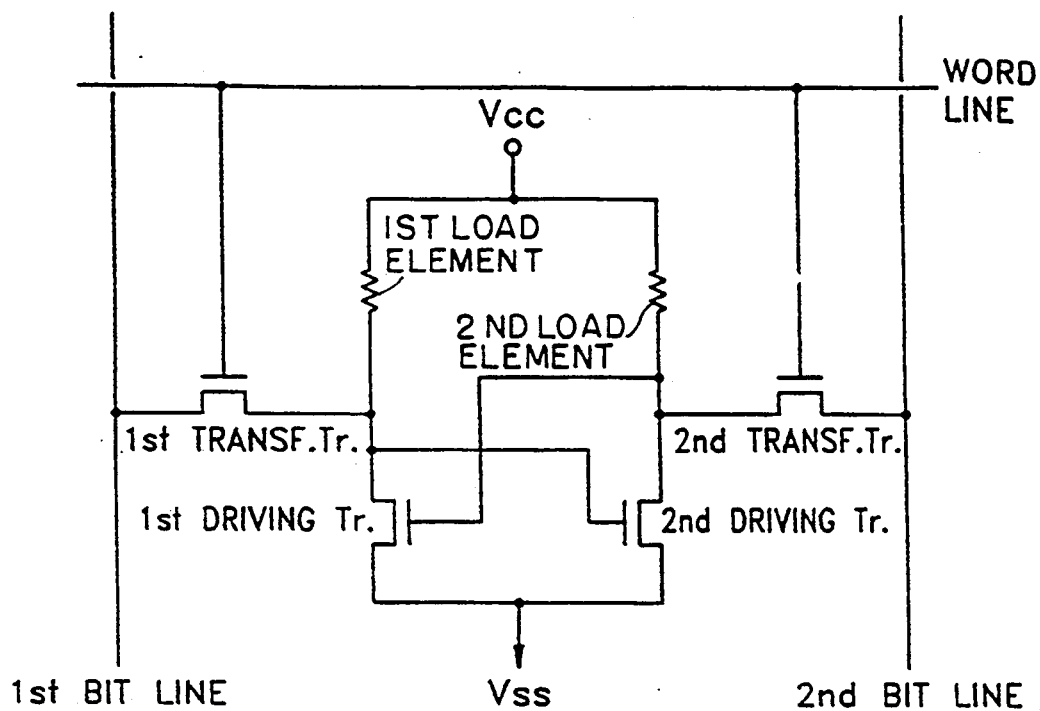
FIG. 1 is a circuit diagram showing a conventional SRAM cell which uses high-resistant polysilicon as a load element.
Figure 2:
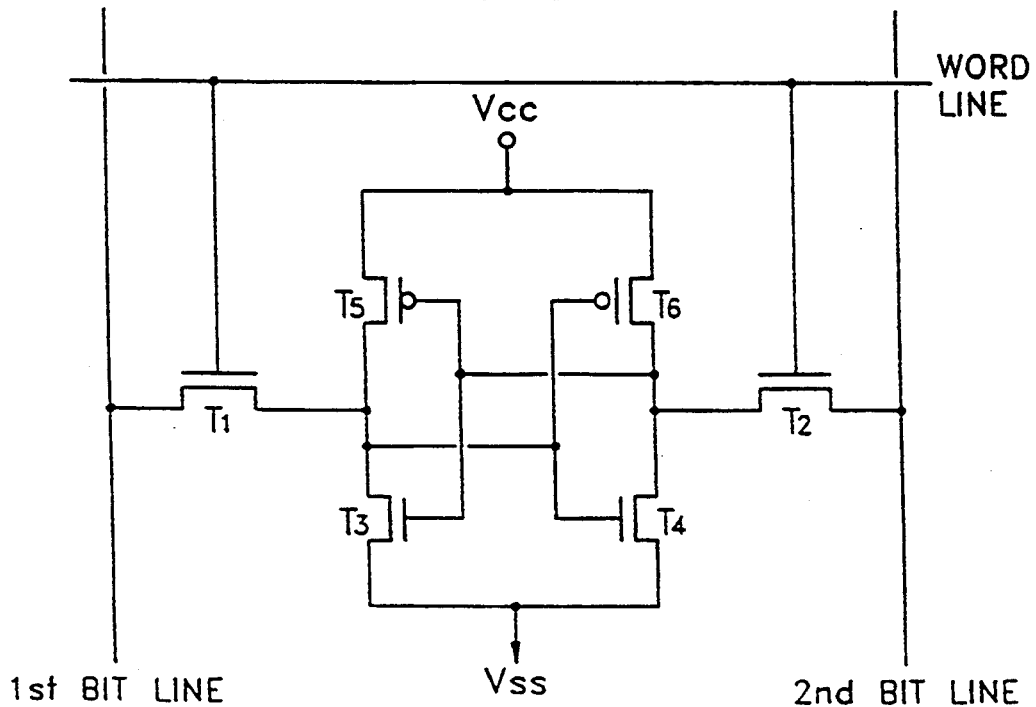
FIG. 2 is a circuit diagram showing an SRAM cell in accordance with the present invention which uses PMOS thin film transistors as memory cell load elements.

FIG. 2 shows a circuit diagram of an SRAM cell which includes a PMOS thin film transistor (TFT) T5 which is to be manufactured by the method according to the present invention.

The SRAM cell includes first NMOS transfer transistor T1 formed on one side of a cell, its gate being connected to a word line and its drain connected to a first bit line.

Second NMOS transfer transistor T2 is formed on the other side of the cell, its gate being connected to the word line and its drain to a second bit line.

First NMOS driving transistor T3 has its drain connected to the source of first transfer transistor T1, its source to a first constant power supply line Vss, and its gate to the source of second transfer transistor T2.

Second NMOS driving transistor T4 has its drain connected to the source of second transfer transistor T2, its source to first constant power source line Vss, and its gate to the source of first transfer transistor T1.

First load element T5 composed of a PMOS TFT has its drain connected to the drain of first driving transistor T3, its source connected to a second constant power source Vcc line, and its gate connected to both the gate of first driving transistor T3 and the source of second transfer transistor T2.

Second load element T6 is a PMOS TFT whose drain is connected to the drain of second driving transistor T4, its source is connected to second constant power source line Vcc, and its gate is connected to both the gate of second driving transistor T4 and the source of first transfer transistor T1.

First and second transfer transistors T1 and T2, and first and second driving transistors T3 and T4 are formed on a semiconductor substrate. PMOS TFTs T5 and T6 serving as first and second load elements are formed along a different conductive layer.

FIGS. 3A, 4A, 5A, 6A and 7A are sequential. layouts for showing the method for manufacturing a PMOS TFT SRAM cell in accordance with the present invention. Oblique-lined portions along respective layouts are mask patterns.

FIGS. 3B, 4B, 5B, 6B and 7B are sectional views, cut along line A-A' of FIGS. 3A through 7A, which show processes for manufacturing the semiconductor memory device, using the mask patterns drawn on the layouts.

Figure 3A:
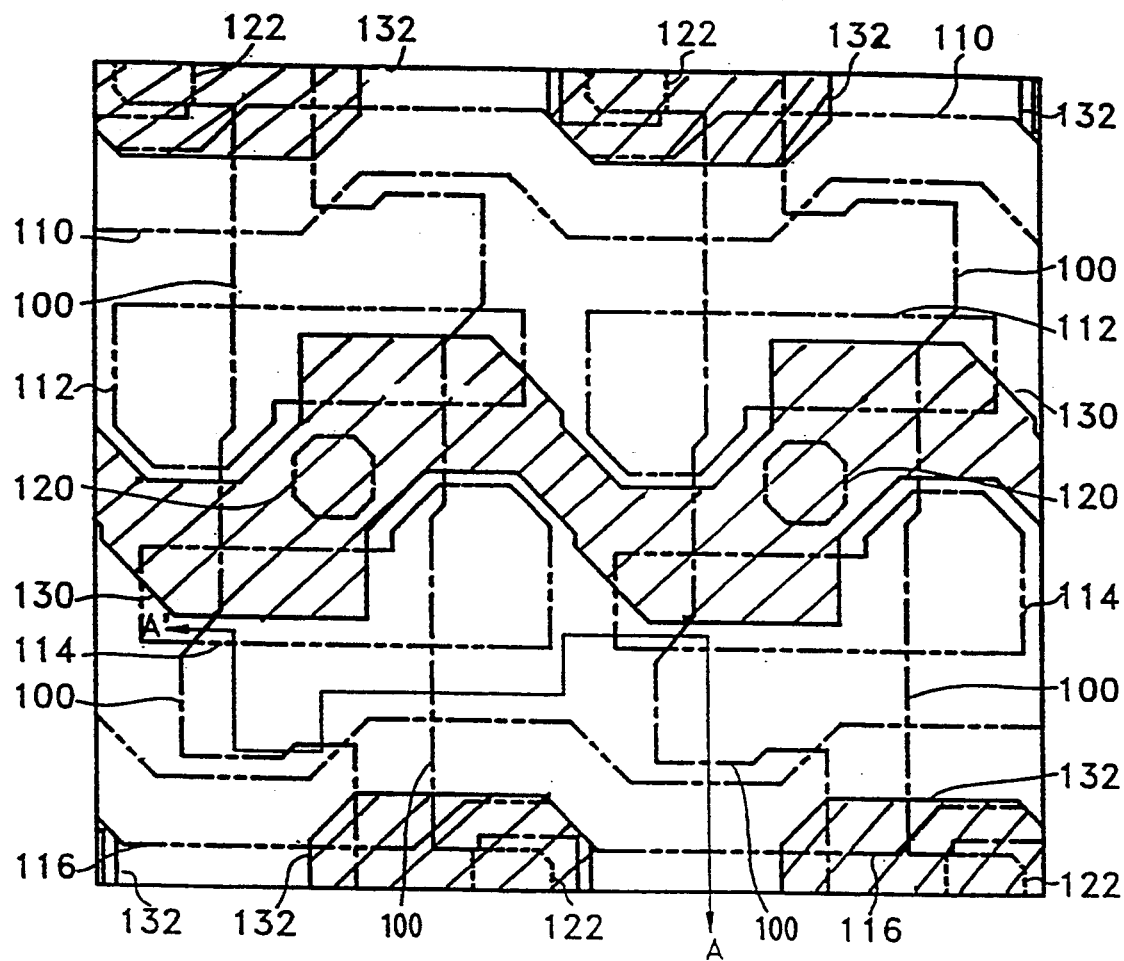
FIGS. 3A, 4A, 5A, 6A and 7A are sequential layouts showing an SRAM cell designed by a method according to the present invention.
Figure 3B:
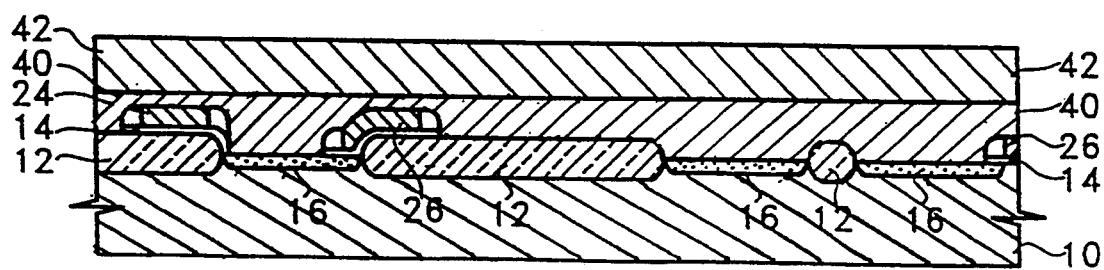
FIGS. 3B, 4B, 5B, 6B and 7B are sectional views for illustrating the manufacturing method of a semiconductor memory device according to the present invention, cut along line A-A' of FIGS. 4A to 7A, respectively.

More specifically, FIGS. 3A and 3B illustrate a process for forming first and second transfer transistors T1 and T2, first and second driving transistors T3 and T4, and first constant power source line Vss of FIG. 2, using mask pattern 100 to prepare a field oxide layer formation.

Mask patterns 110 and 116 are used to form the gates of first and second transfer transistors T1 and T2. Mask patterns 112 and 114 are used to form the gates of first and second driving transistors T3 and T4. Mask pattern 120 is used to form contact holes which will be used to connect first constant power source Vss line to the sources of driving transistors T3 and T4.

Mask pattern 122 is used to form contact holes to prepare a connecting pad to connect a respective bit line to the drains of transfer transistors T1 and T2.

Mask pattern 130 is used to form first constant power source Vss line formation and mask pattern 132 for pad formation and connection to a respective bit line.

Field oxide layer 12 defines the substrate into an active region and an isolation region and is formed using a common local oxidation of silicon (LOCOS) method in accordance with mask pattern 100.

After stacking a gate oxide layer and a first conductive layer on the whole surface of the resultant structure, the gate 24 of first transfer transistor T1, the gate (not shown) of second transfer transistor T2, the gate 26 of first driving transistor T3 and the gate (not shown) of second driving transistor T4, are formed by applying mask patterns 116, 110, 114 and 112, respectively.

Subsequently, impurities of a conductivity type different from that of the substrate are doped into source and drain regions 16 of transfer transistors T1 and T2 and source and drain regions 16 of driving transistors T3 and T4.

An insulating material such as high temperature oxide (HTO) is then coated on the whole surface of the resultant structure. The insulating material is then anisotropically etched to form spacers on the sidewalls of gates; the spacers insulating the gates from adjacent conductive layers.

First insulating layer 40 is formed by coating a material such as HTO on the whole surface of the resultant structure, the surface then being planarized using a material such as borophosphorous silicate glass (BPSG).

Thereafter, contact holes (not shown) in FIGS. 3A and 3B for connecting first constant power source Vss line to the respective sources of driving transistors T3 and T4 are formed in first insulating layer 40 in accordance with mask patterns 120 and 122.

A second conductive layer, made from a semiconductive material, is also deposited on the whole surface of the resultant structure while filling up the contact hole. After forming first constant power source Vss line (not shown) and the pad (not shown) for connection to the respective bit line, second insulating layer 42 composed of silicon dioxide (whose surface is planarized via a chemical vapor deposition (CVD) of BPSG) is formed on the whole surface of the resultant structure.

At this time, polysilicon or a polycide of polycrysilicon/silicide structure is used as the first and second conductive layers, and a planarizing process using BPSG is performed while coating the insulating material after forming the conductive layer pattern, thereby enhancing the reliability of the device.

The lower structure commonly consisting of first and second transfer transistors T1 and T2, first and second driving transistors T3 and T4, first constant power source Vss line, and a connecting pad, can be completed substantially as described above or by using other such similar mask patterning/manufacturing methods as may be conventionally known in the art.

Figure 4A:
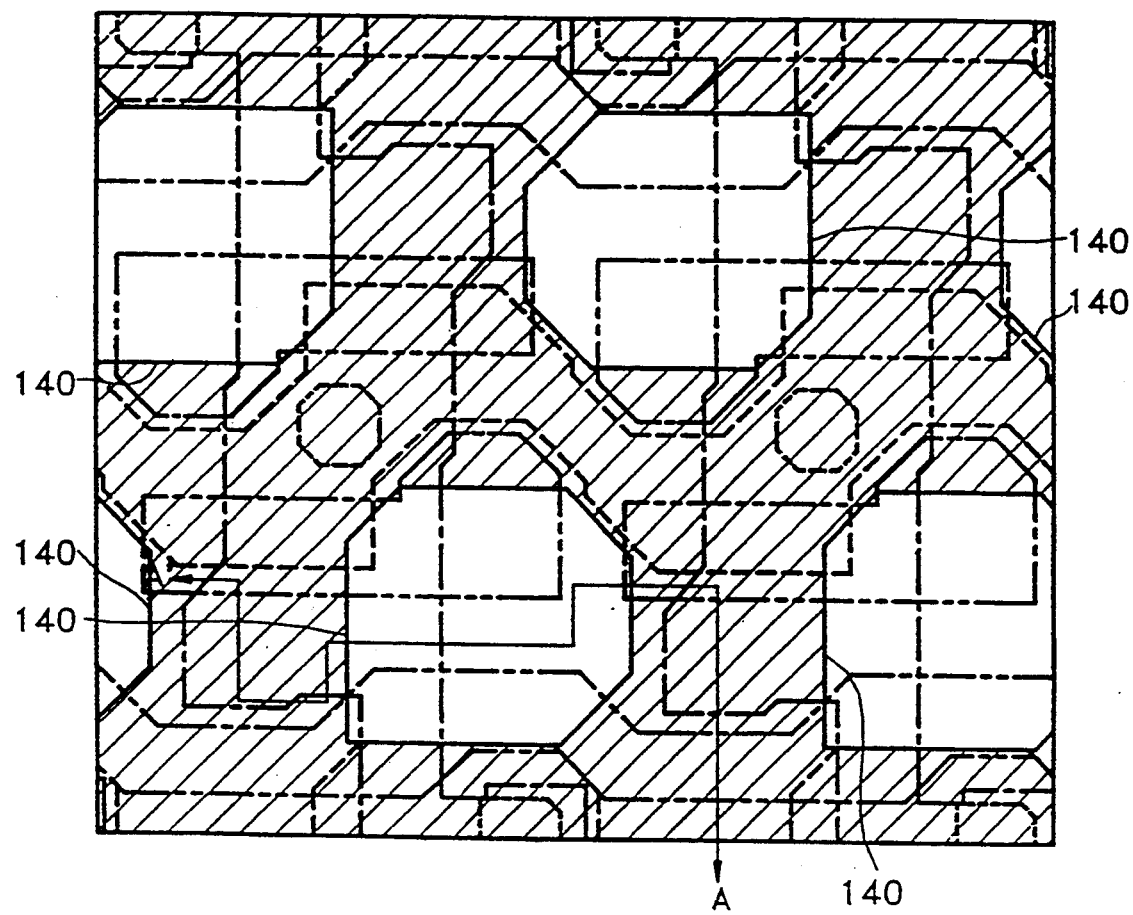
Figure 4B:
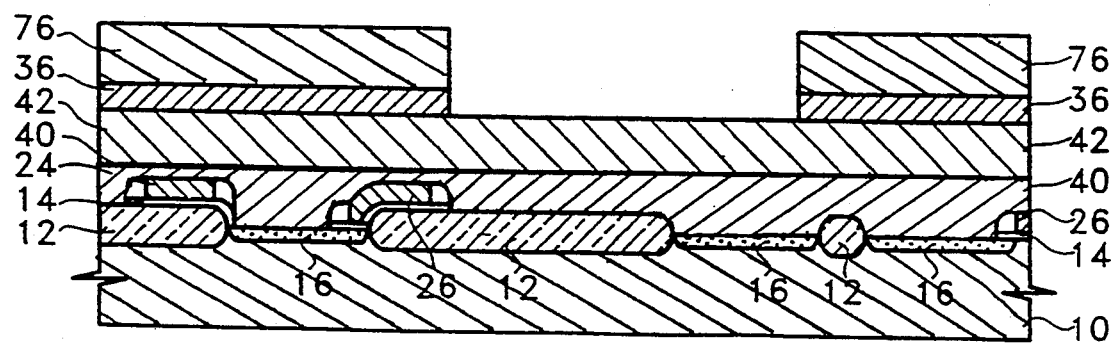

FIGS. 4A and 4B illustrate a process for forming third conductive layer 36 using a mask pattern 140 to form second power source Vcc line and the respective source and drain regions of a PMOS TFT T5. PMOS TFT T6 (not shown in FIG. 4B) is similarly formed.

A conductive material such as polysilicon is deposited on the whole surface of second insulating layer 42 whose surface has been completely planarized. After a P-type impurity, e.g., $BF_2$ ions, is diffused into the polysilicon conductive material and doped to a density of approximately $1.0 \times 10E15$ ions/cm$^2$, a photoresist pattern 76 is formed to partially etch only a region in which the channel of PMOS TFT T5 is to be formed and in accordance with mask pattern 140.

Thereafter, third conductive layer 36 is formed by etching the polysilicon conductive material doped with the $BF_2$ ions using the photoresist pattern 76 as an etchmask. During the etching process, third conductive layer 36 is etched to a thickness of about 1,000 Å to decrease the bulk resistance of the source and drain of the respective PMOS TFT, and also to lower the contact resistance.

Conventionally, because the body (the source, drain and channel) of a PMOS TFT is formed in a thin polysilicon layer to a thickness of about 500 Å. The polysilicon layer must function as an etch-blocking layer during an etching process for forming a contact window to connect the body and another conductive layer, (e.g., a metal layer to be formed in following process). But it is not wide enough to carry out its function, and further is also removed during the etching process. This significantly contributes to the problem of increased contact resistance which can lead to contact failure.

In the present invention, contact failure is prevented by thickly forming the source and drain of each PMOS TFT (T5, T6) (a thickness obtained by summing the third and fourth conductive layers as discussed below). Furthermore, the amount of the $BF_2$ ion is adjusted to effectively reduce bulk resistance of the source and drain of a PMOS TFT; thereby enhancing the operating speed of the transistor.

Figure 5A:
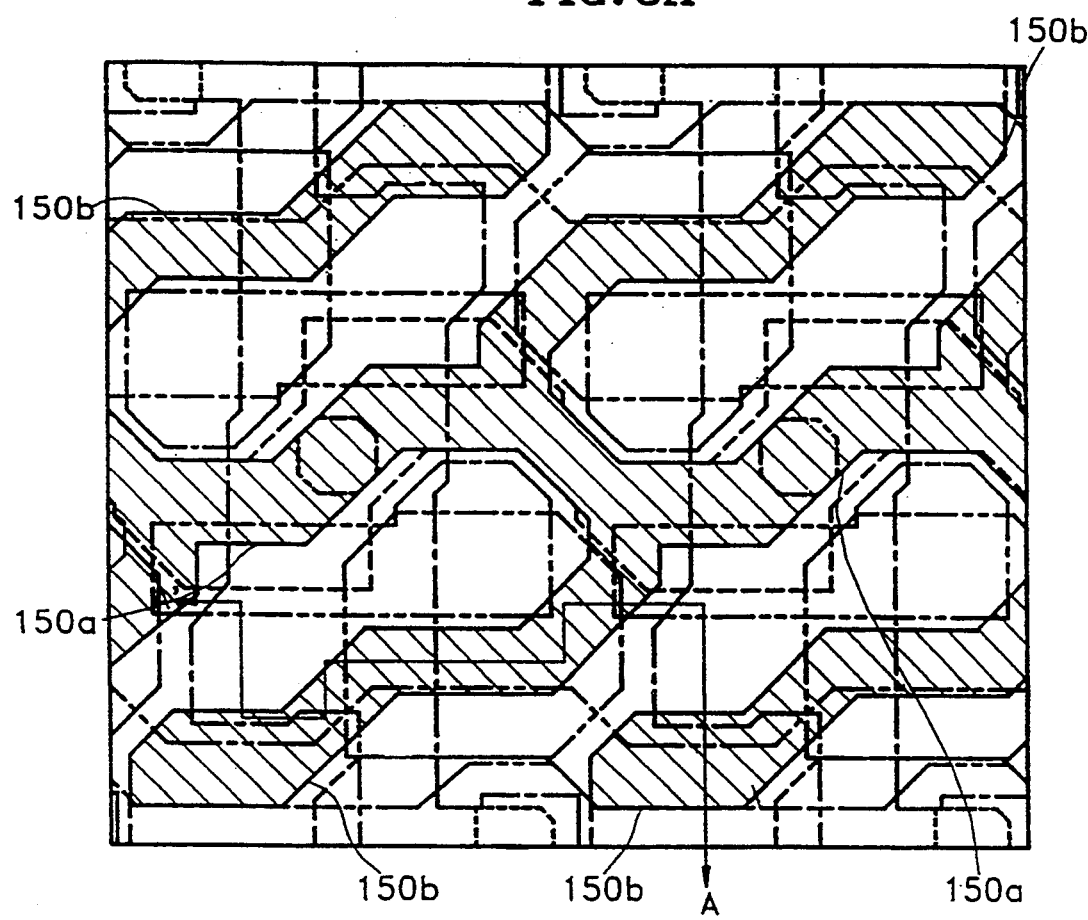
Figure 5B:
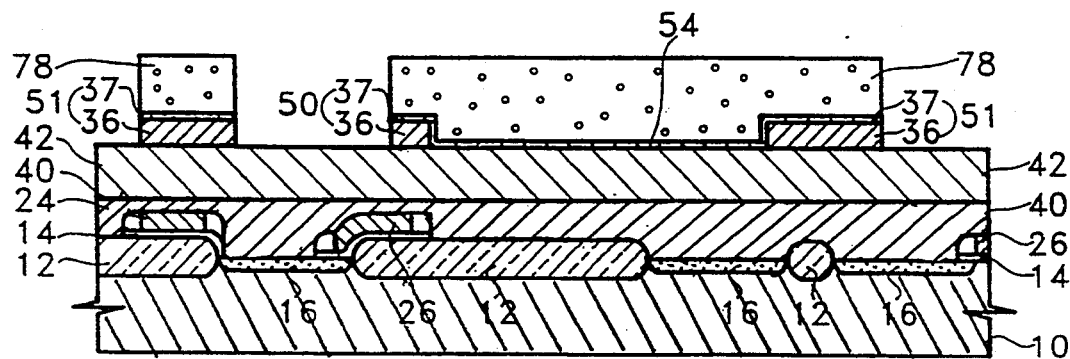

FIGS. 5A and 5B illustrate a process for forming the body (source 50, drain 51 and channel region 54) of PMOS TFT T5, and second constant power source Vcc line (not shown), using mask patterns 150a and 150b.

After amorphous silicon is deposited as a fourth conductive layer 37 to a thickness of about 500 Å in a low temperature, on the whole surface of the resultant structure having third conductive layer 36 thereon, annealing is carried out to create grains and to increase the grain size, at a temperature of about 600° C. for 5 hours in an $N_2$ ambient.

FIGS. 8A and 8B more clearly illustrate the relationship between grain size, grain density and deposition temperature for amorphous silicon.

A paper entitled "A High-Performance Stacked-CMOS SRAM Cell by Solid Phase Growth Technique" (by Y. UEMOTO et al. 1990 Symposium on VLSI Technology, Session 4, pp. 21-22) explains in greater detail how grain size changes in relation to deposition temperature of amorphous silicon.

In this particular situation, even if each of two amorphous silicons deposited at 455° C. and at 515° C., respectively, are annealed at the same temperature (e.g., 600° C.) and for the same duration (e.g., 6 hours), their grain densities will differ, i.e., the density of the amorphous silicon deposited at the lower temperature (455° C.) will be very low.

Because grain density is closely related to leakage current occurring on the grain boundary, the greater grain density will greatly increase the leakage current occurring along grain boundaries.

In order to alter the electrical properties of the PMOS channel, nitrogen and arsenic are implanted in the whole surface of the resultant structure with doses of $0.5 \times 10E15$ to $3.0 \times 10E15$ ions/cm$^2$ and $1.0 \times 10E12$ to $9.0 \times 10E12$ ions/cm$^2$, respectively, thereby forming fourth conductive layer 37.

FIGS. 9A and 9B illustrate the variation of on/off current as a function of the change in density and the type of impurity ion selected when the PMOS TFT is manufactured after implanting the impurity ion to the polysilicon conductive layer. The amorphous silicon transforms into a polysilicon conductive layer when deposited/annealed in which the channel of PMOS TFT T5 will be formed.

FIG. 9A shows the variation of on/off current as a function of a change in the concentration of nitrogen. FIG. 9B shows the variation of on/off current as a function of a change in the concentration of arsenic, the nitrogen concentration being fixed at $2.0 \times 10E15$ ions/cm$^2$.

As shown, the on/off current ratio is as much as seven-orders greater at a nitrogen ion concentration of $1.0 \times 10E15$ to $2.0 \times 10E15$ ions/cm$^2$. However, because the lowest current value must be set at Vg=0 V (where Vg designates a gate voltage) or more in order to be actually applied to the SRAM, the overall I-V (current-voltage) curve should be moved to the right. For this purpose, the arsenic ion is implanted and that result shown in FIG. 9B.

As Shown in FIG. 9B, when the lowest current value is set to where Vg equals 0 V, then the most preferable amounts of arsenic concentrations are $1.0 \times 10E12$ to $3.0 \times 10E12$ ions/cm$^2$.

Conventionally, nitrogen ion concentration can be $0.5 \times 10E15$ to $3.0 \times 10E15$ ions/cm$^2$, and the arsenic ion concentration can be from $1.0 \times 10E12$ to $9.2 \times 10E12$ ions/cm$^2$.

As can be deduced from the graphs shown in FIGS. 9A and 9B, by sequentially performing the doping of the nitrogen ion and the arsenic ion, the "off" current can be kept below 0.2 pA, with an "on" current of more than 80 nA; corresponding to a PMOS TFT on/off current ratio which is different by a seven-order magnitude. As such, a standby current of less than 1 $\mu$A can be obtained for 4M bit SRAMs.

As shown in FIG. 5A and 5B, a photoresist pattern 78 is then formed using mask patterns 150b and 150a for forming the body of PMOS TFT T5 and the second constant power source Vcc line.

As third and fourth conductive layers 36 and 37 are etched, using photoresist pattern 78 as an etch-mask, the body of PMOS TFT T5 and the second constant power source Vcc line are formed.

During the etching process, source 50 and drain 51 in the body of PMOS TFT T5 and the second constant power source Vcc line (not shown) are formed as stacked third and fourth conductive layers 36 and 37.

Channel forming region 54 in the body of PMOS TFT T5 is composed only along fourth conductive layer 37. The electrical properties of PMOS TFT T5 can be significantly tailored by varying the thickness of source 50, drain 51 and second constant power source Vcc line, as well as the thickness of the channel.

It is clearly preferable, however, to thickly form the source and drain regions of a PMOS TFT and of the second constant power source Vcc line, and to thinly form the channel of the PMOS TFT.

Consideration should be given to the fact that impurity (BF$_2$) ions doped into third conductive layer 36 are diffused into fourth conductive layer 37 during the amorphous silicon depositing/annealing processes of FIG. 5B.

Conversely, the nitrogen and arsenic ions doped into fourth conductive layer 37 are diffused into third conductive layer 36 in response to several subsequent annealing processes. However, because the amount of impurities doped into fourth conductive layer 37 is much smaller than that doped into third conductive layer 36, and because fourth conductive layer 37 is much thinner than third conductive layer 36, the impurities in fourth conductive layer 37 have little electrical effects along a region where third and fourth conductive layers 36 and 37 are stacked (i.e., along the source and drain of the PMOS TFT and the second constant power source Vcc line).

Figure 6A:
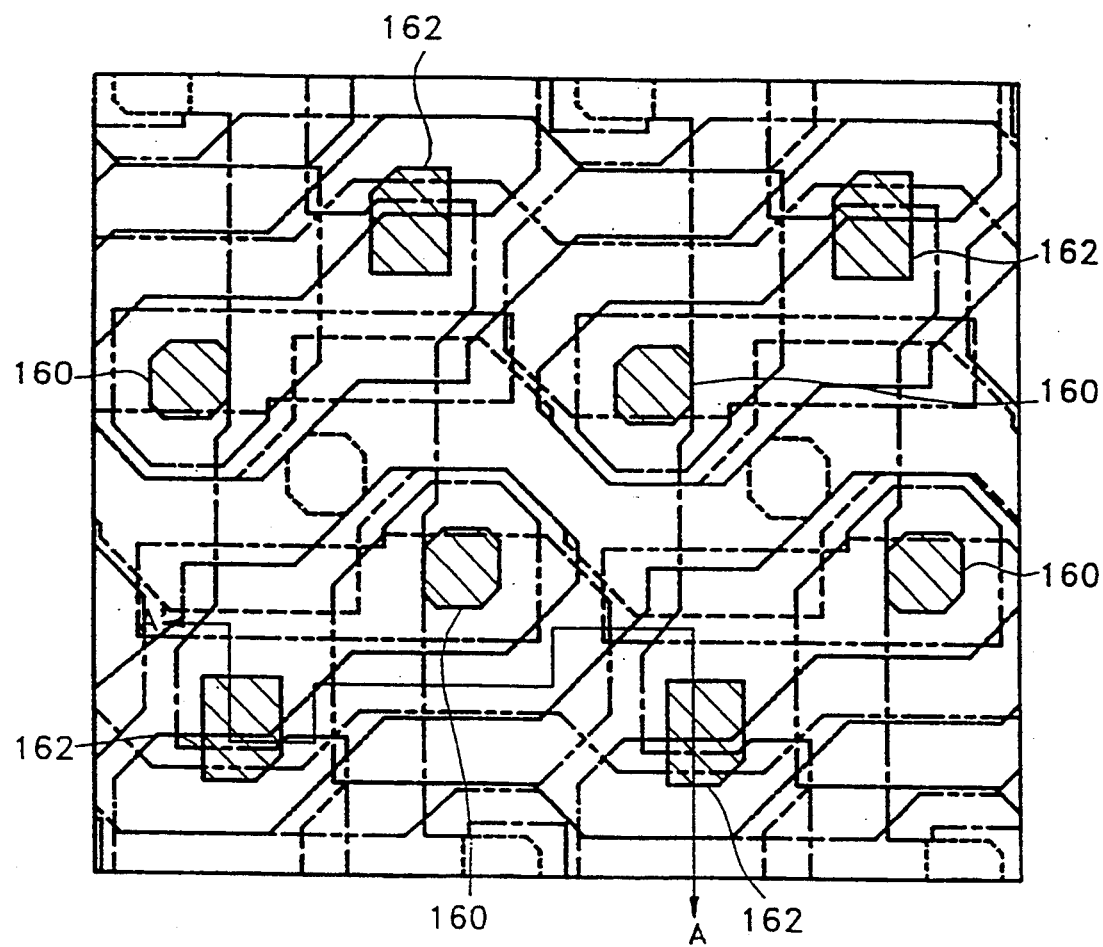
Figure 6B:
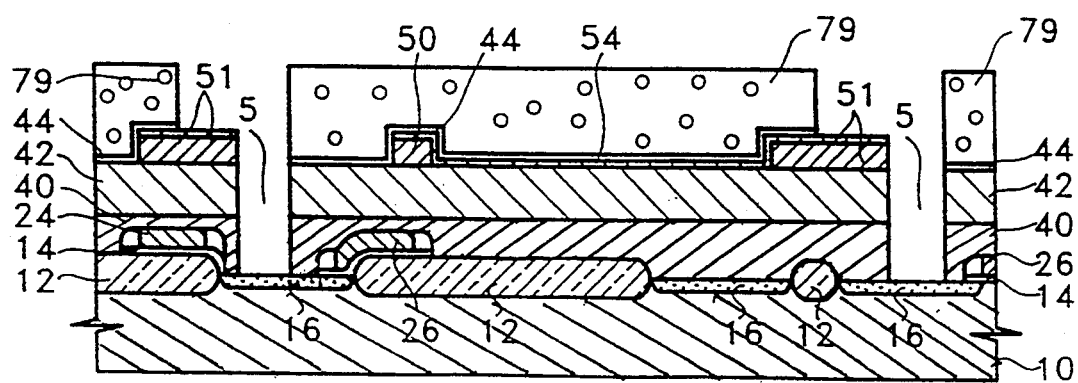

FIGS. 6A and 6B illustrate a process for forming a contact hole 5, using a mask pattern 162 for the contact hole formation used for connecting gate oxide layer 44, drain 51 of PMOS TFT T5, and the drain 16 of driving transistor T3.

A silicon dioxide layer 44 is formed to a thickness of about 800–1,200 Å on the whole surface of the resultant structure on which the body of PMOS TFT T5 and the second constant power source Vcc line are formed via CVD at a temperature of about 810° C.

After depositing a photoresist on the whole surface of the resultant structure, a photoresist pattern 79 is formed for the contact hole formation, using mask pattern 162.

Successively, an anisotropic etching is carried out on the whole surface of the resultant structure, using photoresist pattern 79 as an etch-mask, thereby completing contact hole 5. Mask pattern 160 (FIG. 6A) is thus used to form a contact hole (not shown) which is used for connecting the gate of the driving transistor T3 to the gate of PMOS TFT T5.

Figure 10:
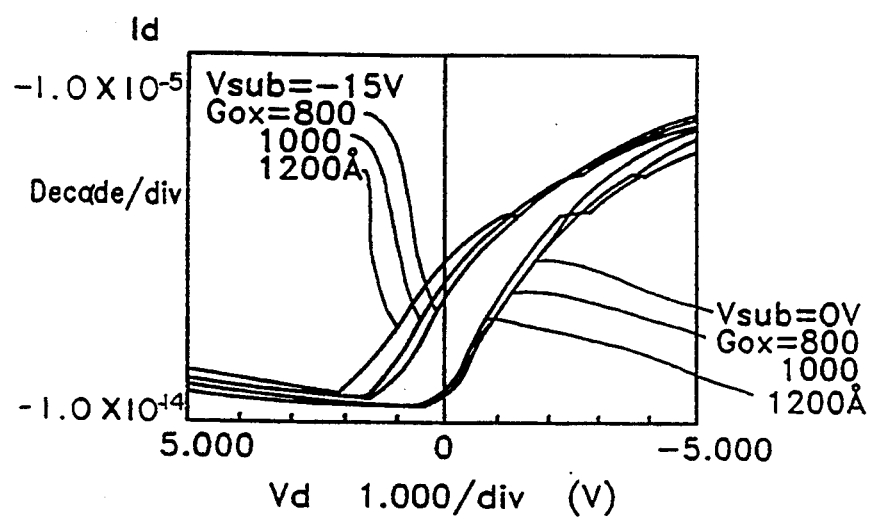
FIG. 10 shows a graph representing the changes in the on/off current ratio as a function of thickness variation of a gate oxide layer.

FIG. 10 shows a graph representing the variation of the on/off current of PMOS TFT T5 as a function of the thickness of gate oxide layer 44. When PMOS TFT T5 is formed as a top gate structure, the threshold voltage of the TFT varies as a function of the voltages supplied to the lower conductive layer; thus, the on/off current of the TFT also changes.

The thicknesses of the channel polysilicon, gate oxide layer, and the insulating layer between the channel polysilicon and the lower conductive layer all play a role in determining optimal on/off current selection.

When the lower conductive layer is a silicon substrate, and the thickness of the insulating layer between the channel polysilicon and lower conductive layer is 0.6 $\mu$m, the influence of a substrate voltage V$_{sub}$ as a function of a variation in the thickness of gate oxide layer is illustrated in the graph of FIG. 10.

As shown, the curve is moved to the left as the gate oxide layer becomes thicker, and its influence becomes great when substrate voltage V$_{sub}$ is $-15$ V. Therefore, the thinner the gate oxide layer is, the smaller the effect of a back-side gate becomes.

Moreover, because contact hole 5 is formed to simultaneously expose drain 16 of driving transistor T3 and drain 51 of PMOS TFT T5, this process is favorable to mass production in that it is much simplified as compared with that of the conventional method wherein one contact hole is formed in the drain of a driving transistor, another contact hole is formed in the drain of a PMOS TFT, and two contact holes are then simultaneously filled with a conductive material therebetween to connect the two drains.

Figure 7A:
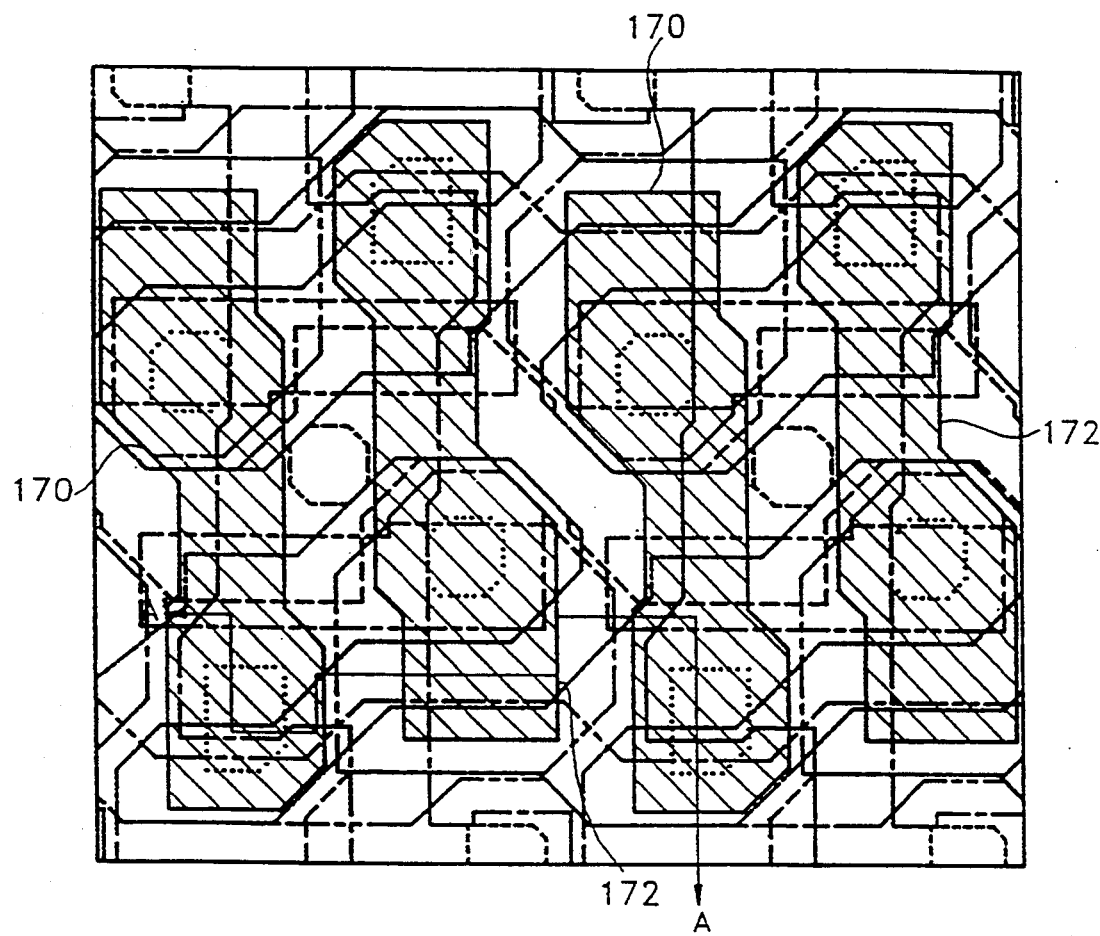
Figure 7B:
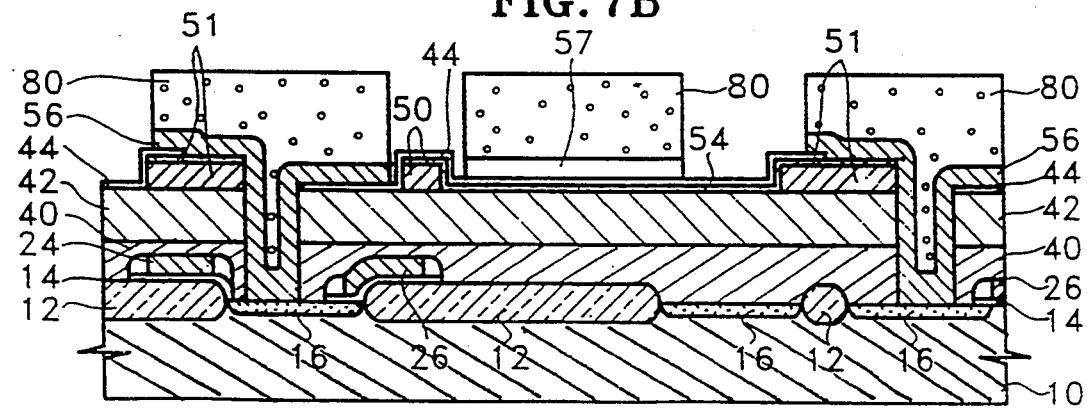

FIGS. 7A and 7B illustrate a process for forming a gate 57 and a connection line 56, using mask patterns 170 and 172 for forming gate 57 of PMOS TFT T5 and connection line 56 for connecting drain 16 of driving transistor T3 to drain 51 of PMOS TFT T5.

Polysilicon is first deposited in a thickness of approximately 1,000 Å on the whole surface of the resultant structure with contact hole (reference numeral 5 in FIG. 6B).

An impurity such as phosphorus oxychloride (POCl$_3$) is then diffused to provide a sheet resistance of about 33 Ohms/square ($\Omega$/■) to 55 $\Omega$/■, thereby forming a fifth conductive layer 56.

Thereafter, a photoresist pattern 80 for forming the gate and the connection line is formed, using mask patterns 170 and 172. An anisotropic etching is performed on the whole surface of the fifth conductive layer, using photoresist pattern 80 as an etch-mask, completing gate 57 and connection line 56.

Because the fifth conductive layer serving as a connection line connected to drain 51 of PMOS TFT T5 is doped with an impurity of a conductivity type different from that of the impurity doped into the third and fourth conductive layers constituting drain 51, there is a possibility of the formation of a PN diode at the contacting portion, which degrades the electrical characteristic of the overall SRAM cell.

Figure 11:
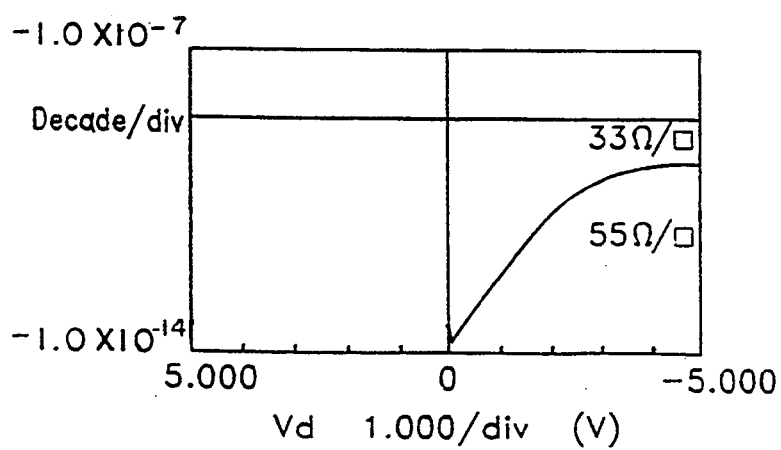
FIG. 11 shows a graph representing the changes in sheet resistance as a function of impurity density variations.

Moreover, when the amount of the impurity ion doped into the fifth conductive layer is increased, the on/off characteristic of a PMOS TFT will vary, (as shown in the graph of FIG. 11), such that the PMOS TFT will not function as a normal load element.

In FIG. 11, the on/off characteristics of the PMOS TFT are compared given a fifth-conductive-layer sheet resistance of 33 $\Omega$/■ and 55 $\Omega$/■, respectively. From FIG. 11, it can be noted that a PMOS TFT operates normally when the sheet resistance is 55 $\Omega$/■.

The distance L between gate 57 composed of the fifth conductive layer and the source and drain of a PMOS TFT is called "offset" and should be taken into consideration when attempting to improve the electrical characteristic of a PMOS TFT.

This distance and its significance is described in a paper entitled "A Polysilicon Transistor Technology for Large Capacity SRAMs" (by Shuji IKEDA et al., IEDM '90, pp. 469–472), wherein the electrical characteristics of a PMOS TFT without offset and a PMOS TFT with an offset of 0.4 $\mu$m are compared.

Electrical characteristics of the PMOS TFT with 4 $\mu$m offset are greatly enhanced over that without the offset. In the present invention, the offset is set above 0.3 $\mu$m.

Furthermore, after executing the anisotropic etching, a P-type impurity ion of not more than 2.0×10E13 ions/cm$^2$ is doped on the whole surface of the resultant structure before removing photoresist pattern 80 so that the PMOS TFT may be formed with a lightly doped offset (LDO) structure.

The effect of the LDO structure on the PMOS TFT is described in a paper entitled "Hot-carrier Induced Ion/Ioff Improvement of Offset PMOS TFT" (by Hiroshi Furuta et al., 1991 Symposium on VLSI Technology, Session 4, pp. 27–28).

Because an additional mask pattern is not required for accomplishing the LDO structure (i.e., because the present invention has a top gate structure), the process of the present invention is simple.

According to the semiconductor memory device and manufacturing method thereof as described above, the source and drain of the respective PMOS TFTs are thickly formed, and the respective channels thinly formed, thereby enhancing the operating speed and contact characteristics of the device.

In addition, an offset region is provided between the two impurity diffusion regions (source and drain) and the gate, and an impurity is doped into the offset region, such that a PMOS TFT having the LDO structure is formed, thereby enhancing the electrical characteristics of the load device.

The impurity doping into the fourth conductive layer which is utilized as the channel region is performed twice (for the nitrogen ions plus the arsenic ions) so that the on/off current ratio is of order seven magnitude, thereby enabling the manufacture of a 4M bit SRAM which can maintain a standby current below 1 $\mu$A.

The connection line for connecting the drain of a PMOS TFT to the drain of a corresponding driving transistor is directly formed through one contact hole (not two), thereby simplifying the manufacture process.

Furthermore, an additional mask is not needed for forming the source and drain of a PMOS TFT or the LDO structure. As a result, according to the above-described effects, the memory device and manufacturing method thereof according to the present invention is suitable for 4M bit or greater capacity SRAM devices.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor memory device for storing one-bit information in one of a plurality of memory cells, each memory cell including two transfer transistors, two driving transistors, and two load transistors, each load transistor comprising:

a source formed of first and second semi-conductive layers with said second semi-conductive layer of said source being stacked on said first semi-conductive layer of said source, said source being connected to a constant power source line, said first and second semi-conductive layers being dissimilarly doped, said first semi-conductive layer being more heavily doped than said second semi-conductive layer;

a drain spaced apart from said source and formed of said first and second semi-conductive layers with said second semi-conductive layer of said drain being stacked on said first semi-conductive layer of said drain, said drain being connected to another drain of a corresponding one of said driving transistors;

a channel region formed substantially of said second semi-conductive layer, said second semi-conductive layer extending from said source through said channel region to said drain; and a gate formed over a gate insulating layer, said gate insulating layer being interposed between said gate and said channel region.

2. A semiconductor memory device as claimed in claim 1, wherein said first semi-conductive layer is thicker than said second semi-conductive layer.

3. A semiconductor memory device as claimed in claim 2, wherein the thickness of said second semi-conductive layer is approximately 500 Å.

4. A semiconductor memory device as claimed in claim 1, wherein the thickness of said gate insulating layer is approximately 800 Å to 1,200 Å.

5. A semiconductor memory device as claimed in claim 1, wherein a lateral distance from said gate to either or both said drain and source of at least one of said load transistor is more than 0.3 μm.

6. A semiconductor memory device as claimed in claim 1, wherein said first and second semi-conductive layers and said gate are composed of polysilicon.

7. A semiconductor memory device as claimed in claim 1, wherein the thickness of said gate is approximately 1,000 Å.

8. A semiconductor memory device as claimed in claim 1, wherein said source and said drain of at least one of said load transistors are doped with a P-type impurity of high density, and said channel region between said source and drain of said at least one of said load transistors is doped with an N-type impurity of low density.

9. A semiconductor memory device as claimed in claim 8, wherein said P-type impurity consists of $BF_2$ ions.

10. A semiconductor memory device as claimed in claim 8, wherein said high density is an impurity concentration of approximately $1.0 \times 10^{15}$ ions/cm$^2$, and said low density is an impurity concentration of approximately $2.0 \times 10^{13}$ ions/cm$^2$.

11. A semiconductor memory device as claimed in claim 1, wherein the drain of at least one of said load transistors is connected to the drain of one of said driving transistors through a single common contact hole.

12. A semiconductor memory device as claimed in claim 1, wherein said second semi-conductive layer comprises nitrogen and arsenic ions at densities of 0.5E15 to 3.0E15 ions/cm$^2$ and 1.0E12 to 9.0E12 ions/cm$^2$, respectively.

* * * * *